US006785318B1

(12) United States Patent
Matsui et al.

(10) Patent No.: US 6,785,318 B1
(45) Date of Patent: Aug. 31, 2004

(54) POLARIZATION MODE CONTROL OF VERTICAL CAVITY SURFACE EMITTING LASERS

(75) Inventors: Yasuhiro Matsui, Lawrence, MA (US); Daryoosh Vakhshoori, Cambridge, MA (US); Peidong Wang, Carlisle, MA (US)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/294,160

(22) Filed: Nov. 14, 2002

Related U.S. Application Data
(60) Provisional application No. 60/411,621, filed on Sep. 18, 2002, and provisional application No. 60/391,299, filed on Jun. 25, 2002.

(51) Int. Cl.[7] .............................. H01S 3/08; H01S 5/00
(52) U.S. Cl. .............................. 372/96; 372/45; 372/46
(58) Field of Search .............................. 372/96, 45–46, 372/27

(56) References Cited

U.S. PATENT DOCUMENTS

| | | | | |
|---|---|---|---|---|
| 6,002,705 A | * | 12/1999 | Thornton | 372/96 |
| 2002/0131462 A1 | * | 9/2002 | Lin et al. | 372/43 |

OTHER PUBLICATIONS

Joma et al. "Polarization Insensitive Semiconductor Laser Amplifiers with Tensile Strained InGaAsP/InGaAsP Multiple Quantum Well Structure," Applied Physics Letters, vol. 62, No. 2, p. 121–122, Jan. 1993.*

Mukaihara et al. "Engineered Polarization Control of GaAs/AlGaAs Surface–Emitting Lasers by Anisotropic Stress form Elliptica Etched Substrate Hole," IEEE Photonics Technology Letters, vol. 5, No. 2, pp. 133–135, Feb. 1993.*
Martin–Regalado et al., Polarization Properties of Vertical-Cavity Surface–Emitting Lasers, IEEE Journal of Quantum Electronics, May 1997, 765–783, vol. 33, No. 5.
Panajotov et al., Impact of in–plane anisotropic strain on the polarization behavior of vertical–cavity surface–emitting lasers, Applied Physics Letters, Sep. 11, 2000, 1590–1592, vol. 77, No. 11.

* cited by examiner

*Primary Examiner*—Don Wong
*Assistant Examiner*—Jams Menefee
(74) *Attorney, Agent, or Firm*—Guerin & Rodriguez, LLP; William G. Guerin (57) ABSTRACT

Described is a semiconductor laser for generating an optical beam having a stable polarization mode. The laser includes a semiconductor structure having an active layer and a stressor disposed on the surface of the semiconductor structure. Birefringence and gain anisotropy are induced in the semiconductor structure in response to the stress applied by the stressor. The active layer includes one or more quantum wells fabricated to generate an interfacial strain and a desired gain anisotropy. By fabricating the active layer away from the stressor, the gain anisotropy induced by the stressor is substantially reduced. Consequently, the gain anisotropy from the interfacial stress is greater than the gain anisotropy induced by the stressor. The resulting semiconductor structure has a maximum refractive index direction that is parallel to the direction of maximum gain, thus enabling a stable polarization mode for the laser.

18 Claims, 7 Drawing Sheets

POLARIZATION MODE CONTROL OF VERTICAL CAVITY SURFACE EMITTING LASERS

CROSS-REFERENCE TO RELATED APPLICATIONS

This application claims priority to U.S. patent application Ser. No. 60/391,299, filed Jun. 25, 2002, titled "Polarization Mode Control of VCSEL by Application of External Uni-Axial Strain" and to U.S. patent application Ser. No. 60/411,621, filed Sep. 18, 2002, titled "Complete Polarization Mode Control of Long-Wavelength Tunable Vertical-Cavity Surface-Emitting Lasers over 65-nm Tuning, Up to 14-mW Output Power", the entirety of each provisional application is incorporated by reference herein.

FIELD OF THE INVENTION

The invention relates generally to vertical cavity semiconductor lasers. More particularly, the invention relates to a method for controlling and stabilizing the polarization mode of vertical cavity surface emitting lasers.

BACKGROUND

Vertical cavity surface emitting lasers (VCSELs) are key components in many optical communication systems. Communication systems based on wavelength division multiplexing (WDM) require a wide range of VCSEL operating wavelengths. This capability is realized, for example, by employing a micro-electro-mechanical (MEM) structure to adjust, or tune, the length of the VCSEL cavity.

The VCSEL cavity generally supports two polarization modes due to the circular symmetry of the cavity and the isotropic properties of the semiconductor materials. In practice, however, a preferential excitation of one of the polarization modes occurs due to imperfections in the circular symmetry and material isotropy. Unfortunately, the resulting polarization mode often exhibits instability. A polarization "flip" from one polarization mode to the other polarization mode can be induced by a minor perturbation in environmental and operational conditions. For example, fluctuations in the ambient temperature or a change in the driving current or in the optical pump power can cause the polarization of the VCSEL beam to switch between polarization modes.

The effect of externally applied stress on the polarization mode of VCSELs has been demonstrated to affect polarization stability. Such lasers require significant hardware to apply the stress to an as-built unit and are not practical for large scale production of VCSEL devices. What is needed is a robust scheme to control the polarization state of VCSELs over a wide range of operation wavelengths that does not require a post-processing adjustment of the VCSEL.

SUMMARY

In one aspect, the invention features a semiconductor laser for generating an optical beam having a stable polarization mode. The semiconductor laser includes a semiconductor structure having an active layer and a surface. The semiconductor laser also includes a stressor adapted to apply a stress to the semiconductor structure to generate a gain anisotropy and a birefringence in the semiconductor structure to stabilize the polarization of the optical beam generated by the semiconductor. In one embodiment, the active layer includes at least one quantum well disposed at a distance from the surface of the semiconductor structure to generate a predetermined gain anisotropy in response to the applied stress. In another embodiment, the active layer includes at least one quantum well having a first region including a first material, a second region including a second material, and an interface between the two regions. A plurality of atomic bonds of different lengths is established across the interface to produce a gain anisotropy in the active layer.

In another aspect, the invention features a semiconductor laser for generating an optical beam having a stable polarization mode. The semiconductor laser includes a semiconductor structure having an active layer. The active layer includes a first semiconductor layer having a first material. The active layer also includes a second semiconductor layer adjacent to the first semiconductor layer and having a second material. A plurality of atomic bonds of different lengths are established across the interface to produce a gain anisotropy in the active layer. In one embodiment, the semiconductor laser also includes a stressor adapted to apply a stress to the semiconductor structure. The stressor induces a birefringence in the semiconductor structure responsive to the applied stress. The polarization mode of the optical beam is stablilzed in response to the gain anisotropy and the birefringence. In another embodiment, the active layer is disposed at a distance from the stressor to generate a predetermined gain anisotropy in response to the applied stress.

In another aspect, the invention features a method for fabricating a semiconductor laser having a stable polarization mode. The method includes forming a semiconductor structure having a quantum well at a predetermined distance from a surface of the semiconductor structure. The method also includes forming a stressor on the surface of the semiconductor structure. The stressor induces a gain anisotropy in the quantum well in response to the predetermined distance and the stressor induces a birefrinence in the semiconductor structure.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
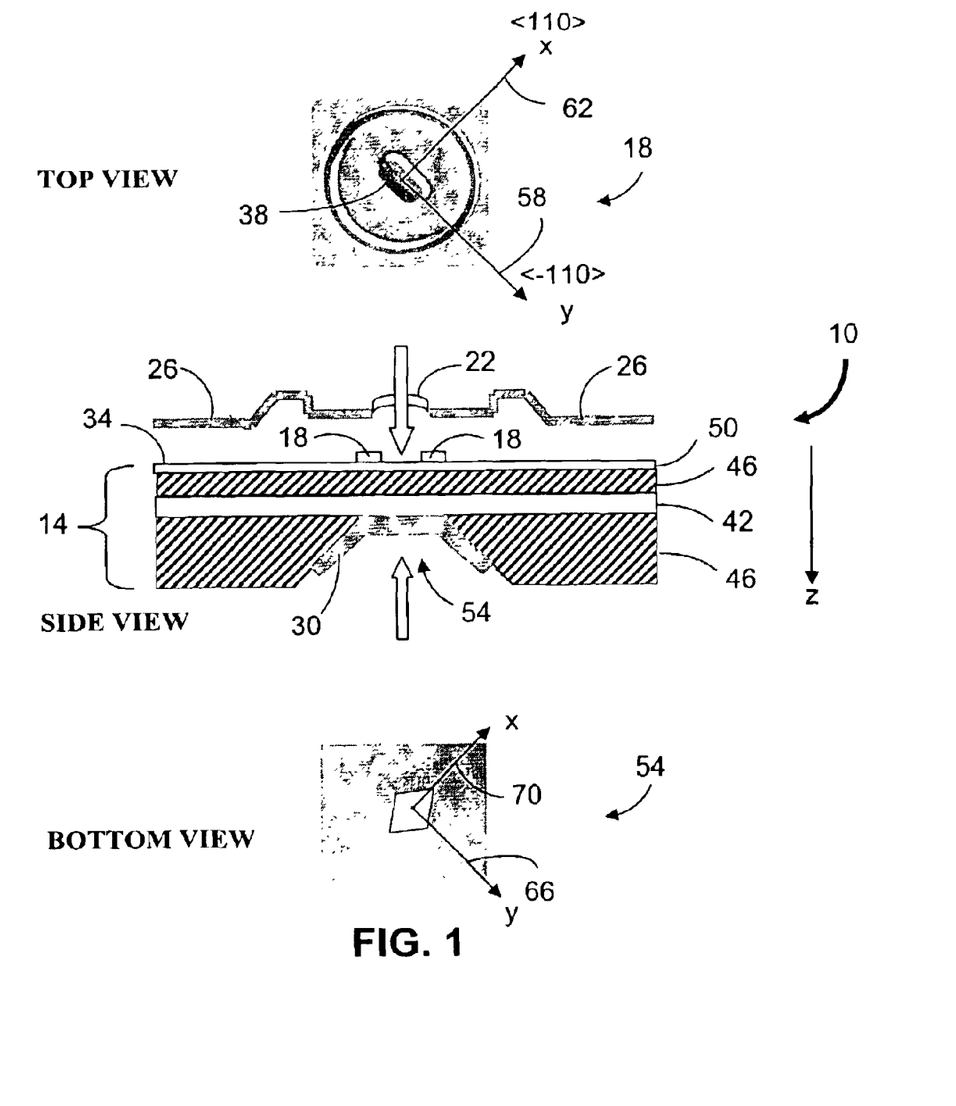
FIG. 1 is an illustration of an embodiment of a semiconductor laser for generating an optical beam having a stable polarization mode in accordance with the invention.

FIG. 1 illustrates a top, side and bottom view of an embodiment of an optically-pumped vertical cavity surface emitting laser (VCSEL) 10 constructed in accordance with the invention. A common reference coordinate system is shown in which the x and y axes are in the plane of the page for the top and bottom view, and the z axis is in the plane of the page for the side view. The VCSEL 10 includes a semiconductor structure 14, a stressor 18, a concave mirror 22 mounted to a membrane 26, and a bottom mirror 30. The semiconductor structure 14 is grown by a metal organic chemical vapor deposition (MOCVD) process and has crystal axes <110> and <-110> parallel to the x and y axes, respectively. The stressor 18 is fabricated by depositing nickel chromium (NiCr) on the top surface 34 of the semiconductor structure 14. The stressor 18 includes a rectangular aperture 38 surrounding a lasing spot defined by the location of the concave mirror 22 and the bottom mirror 30. An externally generated optical pump beam is transmitted through the concave mirror 22 to excite an active layer 42. The active layer includes one or more quantum wells (not shown). Wavelength tuning of the VCSEL output beam transmitted through the bottom mirror 30 is achieved by changing the cavity length defined between the concave mirror 22 and the bottom mirror 30.

The semiconductor structure 14 also includes substrate layers 46 that surround the active layer 42, and an anti-reflection (AR) film 50. The bottom mirror 30 is formed by deposition in a diamond shaped via hole 54 in the semiconductor structure 14. The stressor 18 is oriented so that its major rectangular axis 58 and minor rectangular axis 62 are aligned to the minor axis 66 and major axis 70, respectively, of the via hole 38.

The stressor 18 generates a uni-axial strain on the surface 34 of the semiconductor structure 14 which induces a gain anisotropy and birefringence (i.e., refractive index anisotropy) in the semiconductor structure 14. In the illustrated embodiment a tensile strain is induced along the x <110> direction. The birefringence is induced in the semiconductor structure 14 due to the elasto-optic effect resulting from the applied uni-axial stress. The difference in refractive index for two orthogonal directions x <110> and y <-110≧ yields a separation of lasing wavelengths in the two polarization modes. Because the active layer 42 is thin relative to the cavity length, the wavelength separation for the two polarization modes is primarily determined by the elasto-optic effect in other layers of the semiconductor structure 14.

The elasto-optic effect includes contributions arising from various semiconductor bands having various symmetries including $E_0$, $E_1$, $E_1+\Delta_1$, $E_2+\Delta_2$ gaps. As a result, the linear photoelastic coefficient is in the form of a tensor. The birefringence is calculated according to $$\frac{\Delta\varepsilon_{ij}}{\overline{X}} = \sum_{mn} \varepsilon_{ii}\varepsilon_{jj}p_{ijkl}S_{klmn} \quad (1)$$

in which $\Delta\in_y$ is the change in the real part of the dielectric constants parallel and perpendicular to the direction of the applied stress, $\overline{X}$ is the external tensile stress, $\in_{ii}$ is the dielectric constant tensor, $P_{ijkl}$ is the fourth-rank photoelastic tensor, and $S_{klmn}$ is the component of the elastic compliance tensor. The major axis of the birefringence follows the direction of the external tensile stress $\overline{X}$ and thus can be written as $$n_\| - n_\perp = -\alpha\Delta\varepsilon_{ij} = -\frac{1}{2}\varepsilon_1^{-0.5}\alpha_{pe}\overline{X} \quad (2)$$

in which $n_\|$ and $n_\perp$ are the refractive indices for the two polarization components, $\alpha_{pe}$ is the linear photoelastic coefficient, $\Delta\in_y$ is the change in the real part of the dielectric constant parallel to the y <-110> direction, and $\in_1$ is the real part of the dielectric constant. Thus the direction of the maximum refractive index is parallel to the direction of the applied uni-axial tensile stress, which is in the x <110> direction in the illustrated embodiment. Consequently, the polarization mode in the x <110> direction has a lower frequency (longer wavelength) than the polarization mode in the y <-110> direction.

The corresponding gain anisotropy induced by the uni-axial stress is calculated, for example, using the strain-modified Luttinger-Kohn Hamiltonian. The maximum gain axis is aligned perpendicular to the direction of applied tensile stress according to $$\frac{g_\| - g_\perp}{g_\| + g_\perp} = C(\varepsilon_x - \varepsilon_y) \quad (3)$$

in which $g_\|$ and $g_\perp$ are the gains for the two polarization components, C is a calibration constant of about 40 for indium phosphide (InP) based quantum wells, and $\in_x$ and $\in_y$ are the strains in the x direction and the y direction, respectively. Therefore, according to equations (2) and (3), the polarization mode aligned in the y <-110> direction experiences a larger gain that the polarization mode aligned in the x <110> direction.

Figure 2:
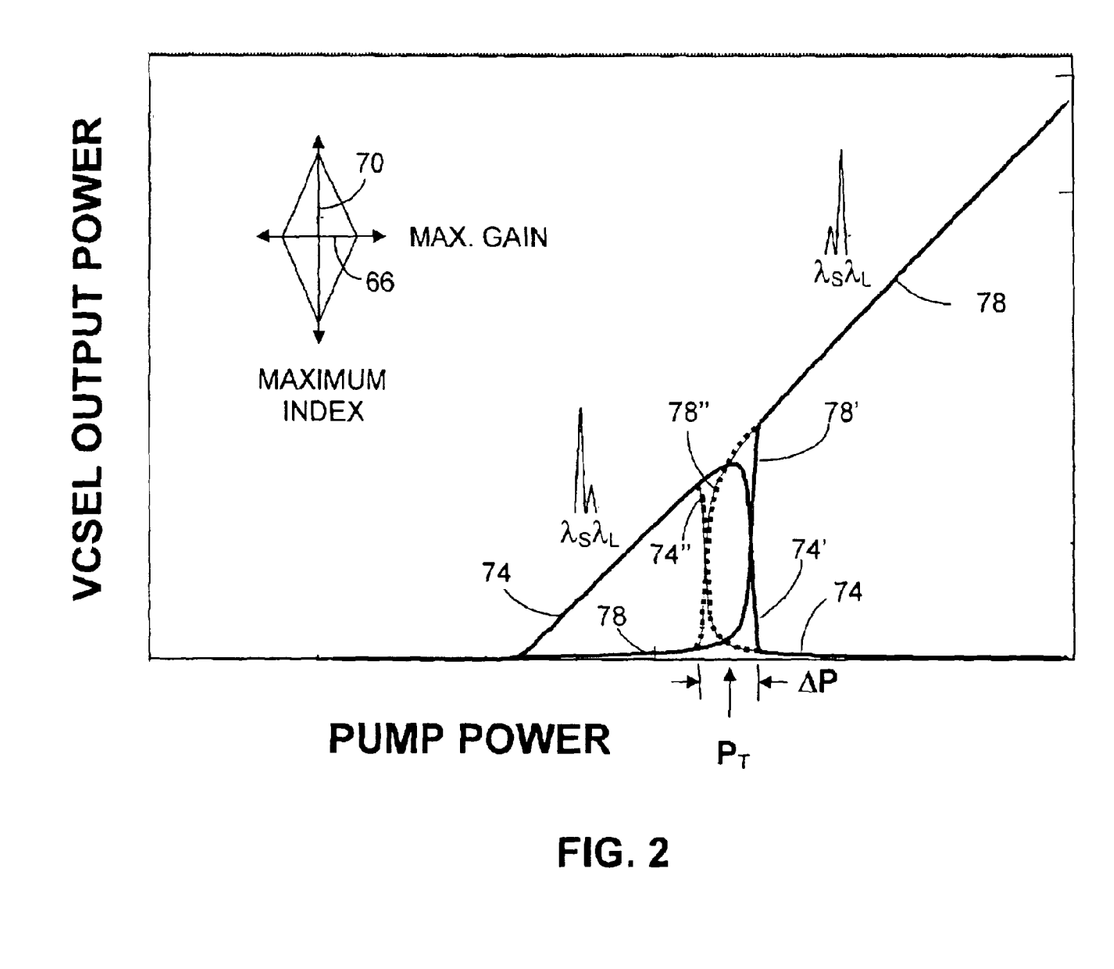
FIG. 2 is a graphical representation of the power and polarization mode of the optical beam from a conventional VCSEL as a function of optical pump power.

FIG. 2 depicts a representative polarization-resolved optical power of the VCSEL beam as a function of the absorbed pump power for one orientation of the stressor 18. In this orientation, the applied stress is rotated approximately 90° with respect to the applied uni-axial stress for the embodiment illustrated in FIG. 1. Consequently, the maximum gain is present along an axis that is perpendicular to the direction of the applied stress and the maximum refractive index is present along an axis that is parallel to the direction of the applied stress. The induced birefringence yields two wavelengths $\lambda_S$ and $\lambda_L$ supported by the laser cavity. For the illustrated relationship, the two wavelengths $\lambda_S$, $\lambda_L$ are separated by 0.15 nm.

Solid lines 74 and 78 represent the optical power of the VCSEL beam for polarization components along the axes 66 and 70, respectively, as the absorbed pump power increases. The graph indicates that the optical power in the VCSEL beam is primarily at the shorter wavelength $\lambda_s$ and is linearly polarized along axis 66 at low pump powers. Typically, the contrast ratio defined by the linear polarization components is 20 dB to 30 dB. As the optical pump power increases, the VCSEL polarization mode remains unchanged until a transition power $P_T$ is reached. The polarization mode then "flips" to a dominant linear polarization that is parallel to the orthogonal axis 70. At optical powers greater than the transition power $P_T$, the optical power of the VCSEL beam is primarily at the longer wavelength $\lambda_L$.

The graph also indicates that the VCSEL exhibits polarization mode hysteresis for a range of pump power about the transition power $P_T$. Solid lines 74' and 78' represent the optical power of the VCSEL beam for polarization components along the axes 66 and 70, respectively, as the pump power is increasing. Dashed lines 74" and 78" represent the optical power of the VCSEL beam for polarization components along the axes 66 and 70, respectively, as the pump power is decreasing. Therefore, the polarization mode near the transition power $P_T$ is determined according to the polarity of the change in the optical pump power upon "entering" the transition region $\Delta P$.

The flip in polarization is problematic in many VCSEL applications in which performance is dependent on polarization. Because the optical pump power is dependent on various parameters, including environmental parameters such as ambient temperature and injection current, the polarization mode also shifts in response to these changes.

Figure 3A:
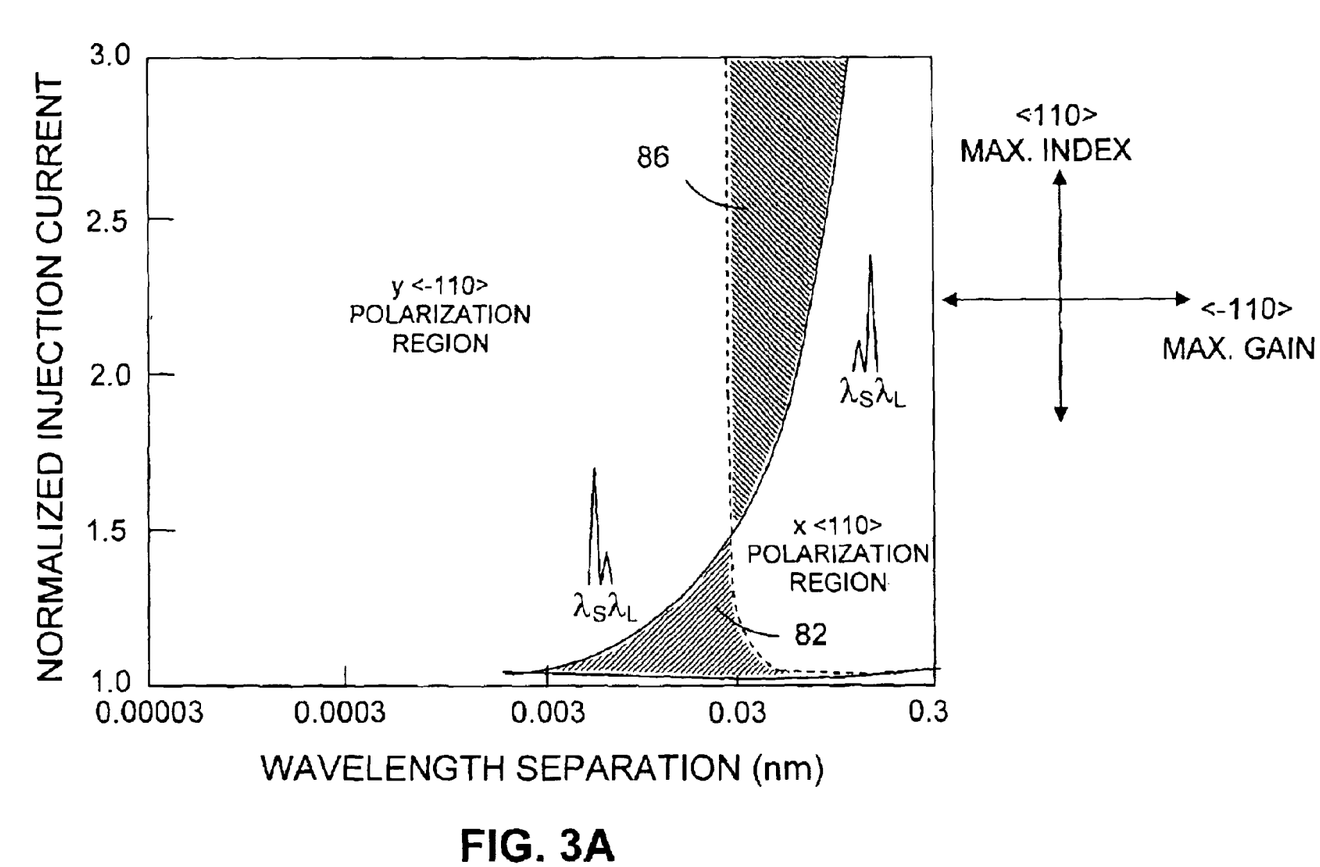
FIG. 3A and FIG. 3B are graphical representations of the polarization mode of the optical beam from a conventional VCSEL as a function of birefringence and injection current.
Figure 3B:
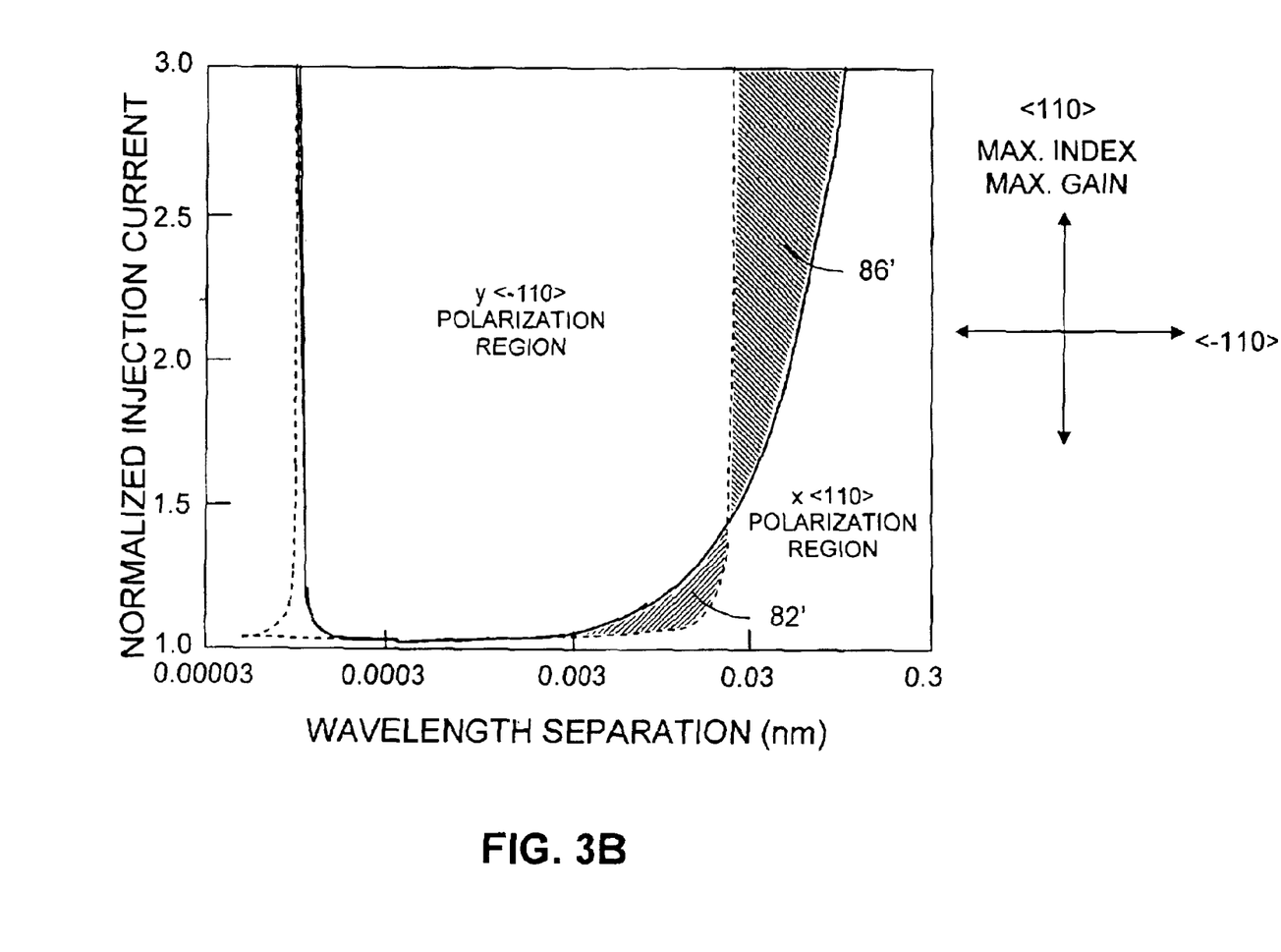

FIGS. 3A and 3B graphically display the boundaries and regions (i.e., areas between the boundaries) for stable polarization modes as a function of birefringence and injection current. The horizontal axes represent the wavelength separation for the two polarization modes resulting from the birefringence in the semiconductor structure 14. The vertical axes represent the injection current normalized to the lasing threshold injection current. As indicated in the graphical inserts, the axis of maximum refractive index is perpendicular to the axis of maximum gain in FIG. 3A and the axis of maximum refractive index is parallel to the axis of maximum gain in FIG. 3B.

Referring to FIG. 3A near the lasing threshold, the VCSEL output beam is at the shorter wavelength $\lambda_s$ and is primarily linearly polarized in the y <−110> direction. For a wavelength separation exceeding approximately 0.03 nm, the polarization mode "hops" to the longer wavelength $\lambda_L$ with a linear polarization in the x <110> direction after a small increase in the injection current. Mono-stable linear polarization in the y <−110> direction exists for a wide range of injection current when the birefringence wavelength separation is less than 0.03 run. In practice, however, the small birefringence results in an unstable polarization mode which can be perturbed by environmental factors such as fluctuations in the ambient temperature. Shaded region 82 represents the values of wavelength separation and injection current for which hysteresis, as previously described, is observed. Shaded region 86 represents the values of wavelength separation and injection current for unstable polarization. In this region 86, the polarization mode behavior is chaotic and shifts unreliably between polarization in the x direction and polarization in the y direction.

Referring to FIG. 3B, the unshaded regions represent wavelength separations and injection current values for which stable polarization is observed. Shaded regions 82' and 86' represent the range of wavelength separation and injection current for which hysteresis and unstable polarization, respectively, are observed. The VCSEL operates with a linear polarization in the x <110> direction for wavelength separations and injection current values described by the area to the right of shaded regions 82' and 86'. For the stable x <110> polarization region, the range of injection current values increases as the wavelength separation increases. Therefore, in order to achieve a stable polarization mode over a wide range of operating conditions, it is preferred to operate with the axis of maximum refractive index parallel to the axis of maximum gain. Moreover, it is desirable to establish a birefringence sufficient to support a wide range of injection current for the stable polarization mode.

As described above, application of a stress to the semiconductor structure 14 results in the maximum gain axis being aligned perpendicular to the direction of the applied stress and the maximum refractive index axis being aligned parallel to the direction of the applied stress. Consequently, the VCSEL polarization mode is subject to the polarization flip as described for FIG. 3A. Thus it is desirable to adjust the gain anisotropy according to an independent means to cause the maximum gain axis to be parallel to the maximum refractive index and thereby operate according to the stable polarization region of FIG. 3B.

According to the present invention, the gain anisotropy and birefringence are independently controlled by adjusting the position of the active layer 42 in the z direction (see FIG. 1). Thus, by fabricating the active layer 42 at the proper depth in the semiconductor structure 14, the maximum gain axis and the maximum refractive index axis of the VCSEL are made parallel.

Figure 4:
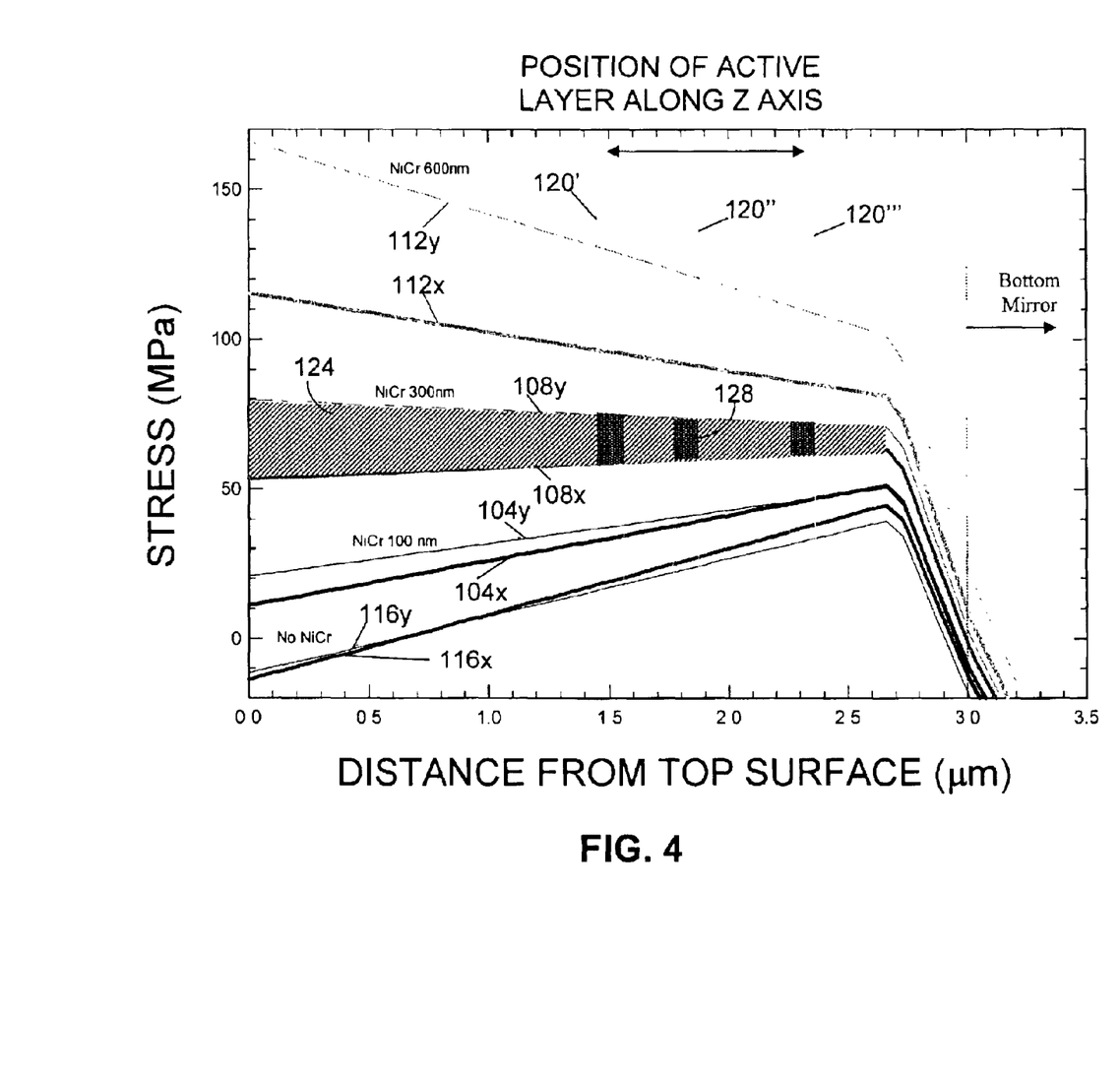
FIG. 4 is a graphical representation of gain anisotropy and birefringence as a function of the magnitude of an applied uni-axial stress and the depth of quantum wells in the semiconductor structure of a VCSEL in accordance with the invention.

FIG. 4 is a graphical depiction of the stress as a function of depth in the semiconductor structure 14 for the VCSEL 10 of FIG. 1. The horizontal axis represents the distance from the top surface 34 of the semiconductor structure 14 in microns and the vertical axis represents the local stress in mega Pascals. Lines 104, 108 and 112 represent the stress for NiCr stressors of thickness 100 nm, 300 nm and 600 nm, respectively. Dashed lines 116 represent the stress for the case in which no stressor is present. The letters "x" and "y" designate the stress along the x <110> and y <−110> axes, respectively. Rectangles 120', 120" and 120''' (generally 120) represent three example locations of the active layer 42 in the structure 14.

The birefringence induced in the semiconductor structure 14 for a given stress is proportional to the area in the graph that lies between the two stress lines for a given NiCr stressor thickness. The gain anisotropy induced by the stress is proportional to the area in the rectangle 120 that overlaps the stress lines 104, 108 or 112. For example, for a 300 nm thick NiCr stressor 18 and an active layer 42 fabricated approximately 1.8 $\mu$m from the semiconductor surface 34, the induced birefringence is proportional to the area 124 between stress lines 108$x$ and 108$y$, and the gain anisotropy is proportional to the area 128 defined by the intersection of the stress lines 108$x$, 108$y$ and the active layer rectangle 120". The gain anisotropy induced by the applied stress decreases for structures 14 fabricated with active layers 42 at increasing distances from the top surface 34. Thus it should be recognized that the gain anisotropy can be adjusted independent of the birefringence according to the position of the active layers 42, or quantum wells, in the semiconductor structure 14. This independent adjustment of gain anisotropy permits structures 14 to be fabricated with the maximum refractive index axis parallel to the maximum gain axis.

Another source of gain anisotropy is based on the difference of atomic bond lengths among constituent atoms at an interface within each quantum well. The interface is defined between a first region having a first semiconductor material and a second region having a second semiconductor material. In one embodiment, the first region includes an indium phosphide (InP) based material and the second region includes a gallium arsenide (GaAs) based material. The degree of gain anisotropy is controlled using a growth interruption sequence, for example, during the growth of quantum wells by MOCVD or molecular beam epitaxy. The growth interruption sequence is used to change the surface state at the interface of the two semiconductor materials and is implemented during a period of time occurring after the termination of growth of one semiconductor material and prior to the starting the growth of another semiconductor material. This technique for generating gain anisotropy within the quantum well interface plane can be utilized to control gain anisotropy independently from the birefringence generated by the stressor 18 and, therefore, to achieve a stable polarization state for the VCSEL 10. For example, InGaAsP/InGaAsP quantum well structures grown by a MOCVD technique can provide a gain anisotropy that is counteracted by the gain anisotropy induced by an appropriately oriented stressor 18.

Figure 5:
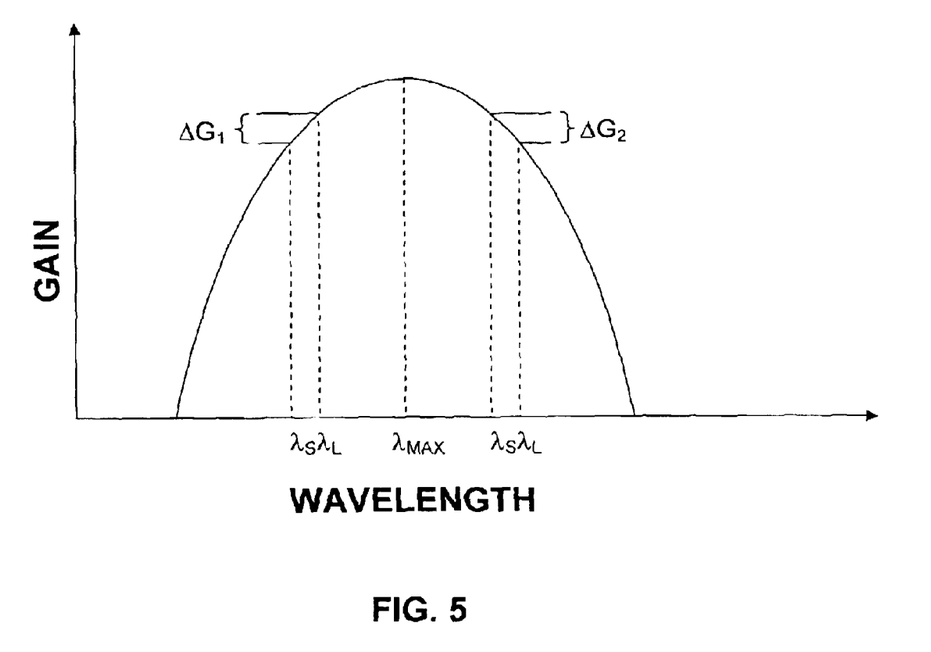
FIG. 5 is a graphical representation of one source of gain anisotropy resulting from the combined effect of the wavelength separation due to the birefringence and a wavelength dependence of the gain.

Gain anisotropy can arise by other physical means. For example, gain anisotropy occurs as a result of the combined effect of the wavelength separation due to the birefringence and a wavelength dependent gain. Referring to FIG. 5, if the population inversion establishing the gain is achieved in the active layer 42 of the semiconductor structure 14, the gain changes with wavelength approximately according to an inverted parabolic function. If the lasing wavelengths $\lambda_s$ and $\lambda_L$ are shorter than the wavelength $\lambda_{MAX}$ for maximum gain, the longer wavelength $\lambda_L$ experiences the larger gain. Conversely, if the lasing wavelengths $\lambda_s$ and $\lambda_L$ are longer than the wavelength $\lambda_{MAX}$ for maximum gain, the shorter wavelength polarization mode exhibits the larger gain. This gain difference $\Delta G$ can be utilized to enhance the stability of the polarization mode. However, this method cannot be readily applied to a laser with a tuning range because the combined effect of gain shape and birefringence mode separation is not consistent when tuning the laser through the wavelength $\lambda_{MAX}$ of maximum gain. In particular, the sign of the gain difference $\Delta G_1$ at wavelengths less that the peak gain wavelength $\lambda_{MAX}$ is opposite the sign of the gain difference $\Delta G_2$ at wavelengths greater than the peak gain wavelength $\lambda_{MAX}$.

The following description of an embodiment of a method according to the invention utilizes three aspects discussed above to fabricate a VCSEL having a stable polarization mode. Referring to FIG. 1 and the method 150 represented in FIG. 6, fabrication of a polarization stabilized VCSEL includes fabrication of the active layer 42 to achieve a desired interfacial strain; fabrication of the active layer 42 at a known distance from the surface 34 of the semiconductor structure 14; and fabrication of a stressor 18 of known thickness and orientation.

Figure 6:
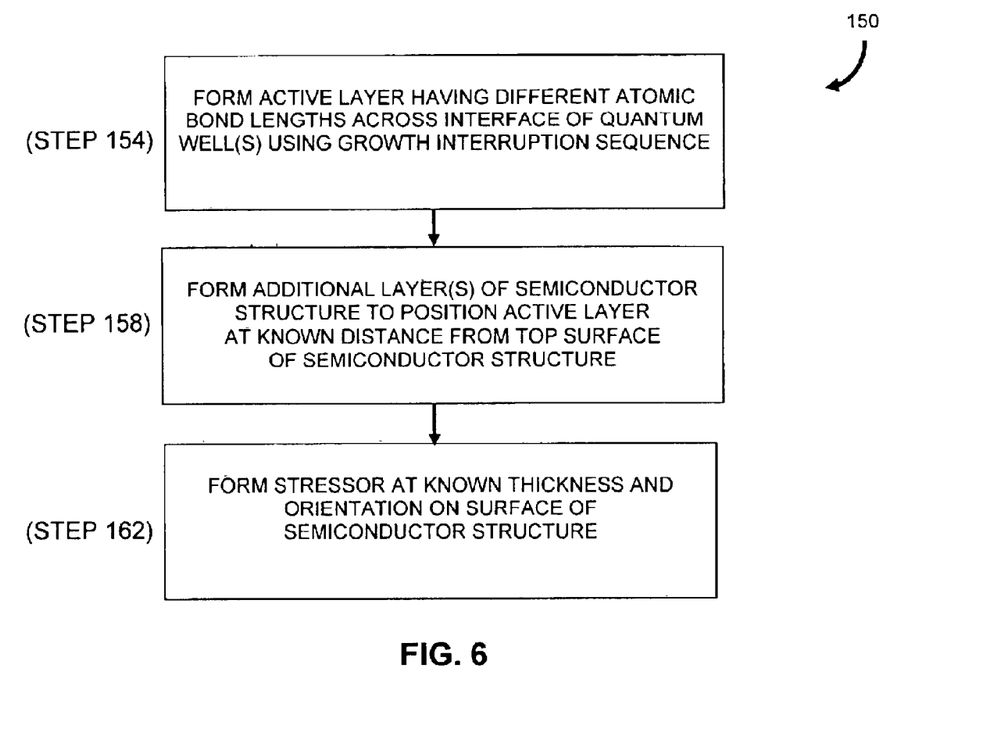
FIG. 6 is a flowchart representation of an embodiment of a method for controlling the polarization of an optical beam emitted from a semiconductor laser in accordance with the invention.

As previously described, the active layer 42 is formed (step 154) in the semiconductor structure 14 using, for example, a growth interruption sequence. The quantum wells of the active layer 42 include bonds of different length across their interfaces between the constituent atoms. Thus, interfacial strain is generated in the active layer 42. The resulting gain anisotropy yields a maximum gain directed parallel to the direction of the maximum refractive index, i.e. along the <110> crystal axis of the semiconductor structure 14. This is the desired orientation for the net maximum gain axis for the VCSEL 10. Therefore, it is desirable to reduce the magnitude of the perpendicular gain anisotropy in the active layer 42 induced by the NiCr stressor 18 so that the interfacial strain in the quantum wells is the dominant cause of gain anisotropy. This is accomplished by adjusting the thickness of the NiCr stressor 18. To increase the tolerance for thickness control, the active layer 42 is formed (step 158) in the semiconductor structure 14 away from the top surface 34 (i.e., near the bottom mirror 30). Thus, according to this procedure, a VCSEL 10 is realized in which the maximum refractive index axis and the maximum gain axis are parallel.

The thickness of the NiCr stressor 18 is selected to achieve the desired birefringence in the semiconductor structure 14. The NiCr stressor 18 is formed (step 162) on the surface 34 of the semiconductor structure 14 in an orientation so that the short axis and long axis of its rectangular aperture 38 are parallel to the <110> and <-110> semiconductor directions, respectively. This results in a large net tensile strain on the top surface 34 along the x <110> direction. This net tensile strain induces birefringence in which the maximum refractive index is oriented along the x <110> direction. Consequently, the wavelength of the polarization mode along the x<110> direction is longer than the wavelength of the polarization mode aligned along the y <-110> direction.

The polarization modes of the exemplary laser are constrained according to FIG. 3B. Thus, when the birefringence induced separation of the wavelengths $\lambda_s$ and $\lambda_L$ is greater than 0.03 nm, no polarization transition boundary is crossed as the injection current (pump power) is increased to at least three times the lasing threshold current. By increasing the birefringence, even larger injection current ranges for stable polarization operation are achieved.

While the invention has been shown and described with reference to specific preferred embodiments, it should be understood by those skilled in the art that various changes in form and detail may be made therein without departing from the spirit and scope of the invention as defined by the following claims. For example, the stressor can be fabricated from a range of materials. In another example, the stressor is configured to apply a compressive stress along the surface of the semiconductor structure and the other design parameters are then altered accordingly. Moreover, although the invention has been described with respect to a VCSEL, it should be understood that the principles of the invention apply to other semiconductor lasers exhibiting birefringence and gain anisotropy.

What is claimed is:

1. A semiconductor laser for generating an optical beam having a stable polarization mode, comprising:

a semiconductor structure having an active layer and a surface, the active layer comprising at least one quantum well having a first region having a first material, a second region having a second material, and an interface defined therebetween, the interface having a plurality of atomic bonds of different lengths to produce a gain anisotropy in the active layer; and a stressor disposed on the surface of the semiconductor structure, the stressor adapted to apply a stress to the semiconductor structure to generate a gain anisotropy and a birefringence in the semiconductor structure and thereby stabilize the polarization mode of the optical beam generated by the semiconductor laser.

2. The semiconductor laser of claim 1 wherein the gain anisotropy defines a maximum gain axis and the birefringence defines a maximum refractive index axis, the maximum gain axis being parallel to the maximum refractive index axis.

3. The semiconductor laser of claim 1 wherein the stressor is disposed on the surface of the semiconductor structure.

4. The semiconductor laser of claim 1 wherein the stressor comprises nickel chromium.

5. The semiconductor laser of claim 1 wherein the active layer comprises at least one quantum well disposed at a distance from the surface of the semiconductor structure to generate a predetermined gain anisotropy in response to the applied stress.

6. The semiconductor laser of claim 1 wherein the semiconductor structure is a component of a vertical cavity surface emitting laser.

7. The semiconductor laser of claim 1 wherein the first material comprises an indium phosphide based material.

8. The semiconductor laser of claim 1 wherein the second material comprises gallium arsenide based material.

9. A semiconductor laser for generating an optical beam having a stable polarization mode, comprising:

a semiconductor structure having an active layer, comprising:
- a first semiconductor layer having a first material; and
- a second semiconductor layer adjacent to the first semiconductor layer at an interface, the second semiconductor layer having a second material, a plurality of atomic bonds of different lengths being established across the interface to produce a gain anisotropy in the active layer.

10. The semiconductor laser of claim 9 wherein the first material comprises an indium phosphide based material.

11. The semiconductor laser of claim 9 wherein the second material comprises a gallium arsenide based material.

12. The semiconductor laser of claim 9 wherein the semiconductor structure is a component of a vertical cavity surface emitting laser.

13. The semiconductor laser of claim 9 further comprising a stressor adapted to apply a stress to the semiconductor structure, the stressor inducing a birefringence in the semiconductor structure responsive to the applied stress, the polarization mode of the optical beam being stabilized in response to the gain anisotropy and the birefringence.

14. The semiconductor laser of claim 13 wherein the semiconductor structure has a surface and wherein the stressor comprises nickel chromium deposited on the surface of the semiconductor structure.

15. The semiconductor laser of claim 13 wherein the stressor is configured to apply a uni-axial stress.

16. The semiconductor laser of claim 13 wherein the active layer is disposed at a distance from the stressor to generate a predetermined gain anisotropy in response to the applied stress.

17. A method for fabricating a semiconductor laser having a stable polarization mode, comprising:
- forming a semiconductor structure having a quantum well at a predetermined distance from a surface of the semiconductor structure, the quantum well having an interface and a plurality of constituent atoms, the quantum well comprising a plurality of different atomic bond lengths across the interface between the constituent atoms; and
- forming a stressor on the surface of the semiconductor structure, the stressor inducing a gain anisotropy in the quantum well in response to the predetermined distance and the stressor inducing a birefringence in the semiconductor structure.

18. The method of claim 17 wherein the forming a semiconductor structure comprises performing a growth interruption sequence.

* * * * *